United States Patent
Akselrod et al.

(10) Patent No.: US 9,841,544 B2
(45) Date of Patent: *Dec. 12, 2017

(54) DEVICE AND METHOD FOR LUMINESCENCE ENHANCEMENT BY RESONANT ENERGY TRANSFER FROM AN ABSORPTIVE THIN FILM

(71) Applicant: Massachusetts Institute of Technology, Cambridge, MA (US)

(72) Inventors: Gleb M. Akselrod, Cambridge, MA (US); Moungi G. Bawendi, Cambridge, MA (US); Vladimir Bulovic, Lexington, MA (US); Jonathan R. Tischler, Cambridge, MA (US); William A. Tisdale, Cambridge, MA (US); Brian J. Walker, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 418 days.

This patent is subject to a terminal disclaimer.

(21) Appl. No.: 14/563,023

(22) Filed: Dec. 8, 2014

(65) Prior Publication Data

US 2015/0153493 A1 Jun. 4, 2015

Related U.S. Application Data

(63) Continuation of application No. 13/358,750, filed on Jan. 26, 2012, now Pat. No. 8,908,261.

(Continued)

(51) Int. Cl.
*G02B 5/28* (2006.01)
*F21K 2/00* (2006.01)

(Continued)

(52) U.S. Cl.
CPC ............... *G02B 5/288* (2013.01); *F21K 2/00* (2013.01); *G02B 5/28* (2013.01); *G02B 5/286* (2013.01);

(Continued)

(58) Field of Classification Search
CPC ............ G02B 5/288; G02B 5/286; F21K 2/00

(Continued)

(56) References Cited

U.S. PATENT DOCUMENTS 5,780,174 A * 7/1998 Tokito ................. H01L 51/5265
                                                                        313/506
7,649,196 B2 * 1/2010 Tischler .............. H01L 51/5265
                                                                        257/40

(Continued)

FOREIGN PATENT DOCUMENTS

WO 2007095172 A2 2/2006

OTHER PUBLICATIONS

Zhong, et al. "Aggregation and Permeation of 4-(dicyanomethylene)-2-methyl-6-(p-dime thylaminostyryi)-4H-pyran Molecules in Alq", Applied Physics Letters, vol. 8, No. 6, pp. 1122-1124 (Aug. 5, 2002).

(Continued)

*Primary Examiner* — Mark Hellner
(74) *Attorney, Agent, or Firm* — Meagher Emanuel Laks Goldberg & Liao, LLP (57) ABSTRACT

Disclosed are a device and a method for the design and fabrication of the device for enhancing the brightness of luminescent molecules, nanostructures, and thin films. The device includes a mirror, a dielectric medium or spacer, an absorptive layer, and a luminescent layer. The absorptive layer is a continuous thin film of a strongly absorbing organic or inorganic material. The luminescent layer may be a continuous luminescent thin film or an arrangement of (Continued)

isolated luminescent species, e.g., organic or metal-organic dye molecules, semiconductor quantum dots, or other semiconductor nanostructures, supported on top of the absorptive layer.

22 Claims, 7 Drawing Sheets

Related U.S. Application Data (60) Provisional application No. 61/436,395, filed on Jan. 26, 2011.

(51) Int. Cl.
*H01S 3/0915* (2006.01)
*H01L 31/0232* (2014.01)
*H01L 51/44* (2006.01)
*H01S 3/16* (2006.01)
*H01L 51/52* (2006.01)

(52) U.S. Cl.
CPC ........ *G02B 5/287* (2013.01); *H01L 31/02322* (2013.01); *H01L 51/447* (2013.01); *H01S 3/0915* (2013.01); *G02B 2207/113* (2013.01); *H01L 51/5271* (2013.01); *H01S 3/168* (2013.01); *H01S 3/169* (2013.01); *Y02E 10/52* (2013.01); *Y02E 10/549* (2013.01); *Y02P 70/521* (2015.11)

(58) Field of Classification Search
USPC .......................................... 359/590; 427/157
See application file for complete search history.

(56) References Cited

U.S. PATENT DOCUMENTS 8,908,261 B2 * 12/2014 Akselrod ................. G02B 5/28
257/98
2011/0080087 A1 * 4/2011 Chang ................... H01L 51/524
313/504

OTHER PUBLICATIONS

Choong et al. "Photoluminescence Quenching of Alq3 by Metal Deposition: A Surface Analytical Investigation", JVST, vol. 16, No. 3, pp. 1838-1841, (May 1998).

* cited by examiner

DEVICE AND METHOD FOR LUMINESCENCE ENHANCEMENT BY RESONANT ENERGY TRANSFER FROM AN ABSORPTIVE THIN FILM

CROSS-REFERENCE TO PRIOR FILED APPLICATIONS

This application claims priority to U.S. patent application Ser. No. 13/358,750, filed Jan. 26, 2102 now U.S. Pat. No. 8,908,261 and U.S. provisional application 61/436,395 filed on Jan. 26, 2011, which are herein incorporated by reference in their entirety.

This invention was made with Government support under Grant Nos. DE-FG02-07ER46454 and DE-SC0001088 awarded by the Department of Energy and Contract No. W911NF-07-D-0004 awarded by the Army Research Office. The Government has certain rights in the invention.

FIELD OF INVENTION

This invention relates to the field of photoluminescent devices and more particularly to fluorescence enhancement of such devices.

BACKGROUND

Photoluminescence is the process by which a molecule or material absorbs light, and then, after intramolecular or intraband relaxation, re-emits light at a different red-shifted frequency. The brightness of a molecule (defined here as the number of photons emitted per molecule per unit time) is a function of several physical parameters, including the incident light intensity, the internal photoluminescence quantum yield, and the fraction of incident light that is actually absorbed—a property that may be quantified via the absorption cross section. The incident light intensity may be fixed or may be kept at low levels. In these cases, the only way to increase the brightness of emission from a luminescent material, also called a lumophore, is to increase its absorption cross section. However, the absorbance of a molecule or solid material is intimately tied to its atomic composition and cannot be altered without also affecting its luminescent properties. It is desirable to have a device or general method for decoupling the absorption and emission properties of a luminescent thin film so that the brightness of a lumophore could be increased without changing its spectral emission properties or increasing the intensity of light for photoexcitation.

SUMMARY OF THE INVENTION

Disclosed are a device and a method for the design and fabrication of the device for enhancing the brightness of luminescent molecules, nanostructures, and thin films. The device includes a mirror, a dielectric medium or spacer, an absorptive layer, and a luminescent layer. The absorptive layer is a continuous thin film of a strongly absorbing organic or inorganic material. The luminescent layer may be a continuous luminescent thin film or an arrangement of isolated luminescent species, e.g., organic or metal-organic dye molecules, semiconductor quantum dots, or other semiconductor nanostructures, supported on top of the absorptive layer. The absorptive layer absorbs incident light then, by exciton diffusion and resonant energy transfer, excitations in the absorptive layer are transferred to the luminescent layer for subsequent light emission. The feasibility of this method is demonstrated through a working prototype device featuring a J-aggregate thin film as the absorptive layer and isolated fluorescent molecules suspended within a host matrix as the luminescent layer. Such a method for enhancing the brightness of isolated luminescent molecules and nanostructures and luminescent thin films could find applications in high efficiency lighting, chemical sensing, lasers, solar concentrators, photodetectors, single molecule imaging, and near-field microscopy.

BRIEF DESCRIPTION OF THE FIGURES

FIG. 2a is a block diagram of a J-aggregate critically coupled resonator (JCCR) fluorescence enhancement structure with 2.5 nm of DCM:Alq$_3$ (2.5% w/w) deposited on top as the exciton acceptor layer;

FIG. 2b is a graph showing the calculated absorption of the JCCR as a function of SiO2 spacer layer thickness, showing a maximum at 50 nm, corresponding to a resonant condition;

FIG. 2c is a graph showing absorption of the 15-nm thick J-aggregate thin film on quartz and increased absorption of the same film when placed on the critically coupled resonator and excited at 7° relative to normal incidence;

FIG. 2d is a graph showing normalized absorption (solid lines) and emission (dashed lines) spectra of the J-aggregate and DCM:Alq$_3$ layers;

FIG. 5a is a graph showing the emission spectra of isolated DCM film, DCM film on JCCR, and the DCM contribution when atop the JCCR showing a 20-fold enhancement in the spectrally integrated DCM emission;

FIG. 5b is an ambient light image of the DCM film deposited on the JCCR, and encapsulated with UV curing epoxy and a quartz cover slip;

FIGS. 5c-5d are images of DCM emission on quartz substrate (5c) and on JCCR (5d) under $\lambda$=465 nm excitation;

FIG. 5e is a graph showing the enhancement factor of DCM emission as a function of excitation wavelength and comparison to the absorption spectrum of the JCCR;

DETAILED DESCRIPTION OF THE INVENTION

The methods for luminescence enhancement presented herein generally rely upon light absorption within a thin film and subsequent energy transfer to a luminescent layer situated next to this absorptive film. For example, a purely excitonic and large-area approach to the enhancement of lumophore emission may be achieved by coupling the lumophore to a highly absorbing resonant optical structure.

In one embodiment, the absorptive layer may be a thin film of organic or inorganic material having a thickness substantially less than the exciton diffusion length. Typical exciton diffusion lengths are from about 10 to about 100 nanometers (nm). The absorptive film may have an emission spectrum that overlaps with the absorption spectrum of the lumophore. To enhance light absorption within the absorptive layer, a geometry referred to as a critically coupled resonator is used, such as that described in J. R. Tischler, M. S. Bradley, V. Bulovic, Opt. Lett. 31, 2045 (2006), incorporated herein by reference as if fully set forth. In one embodiment, this structure is formed by placing the absorptive layer in front of a mirror at a distance approximately equal to $\lambda/4n$, where $\lambda$ is the wavelength of peak absorption in the absorptive layer and n is the refractive index of the medium.

Figure 1A:
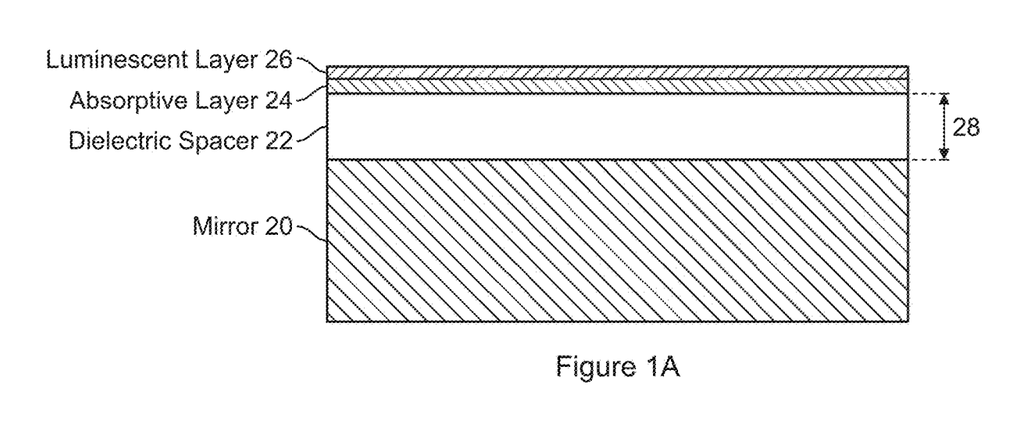
FIG. 1a is a block diagram of a photoluminescent device with planar geometry including a mirror, a dielectric spacer, an absorptive layer, and a luminescent layer.
Figure 1B:
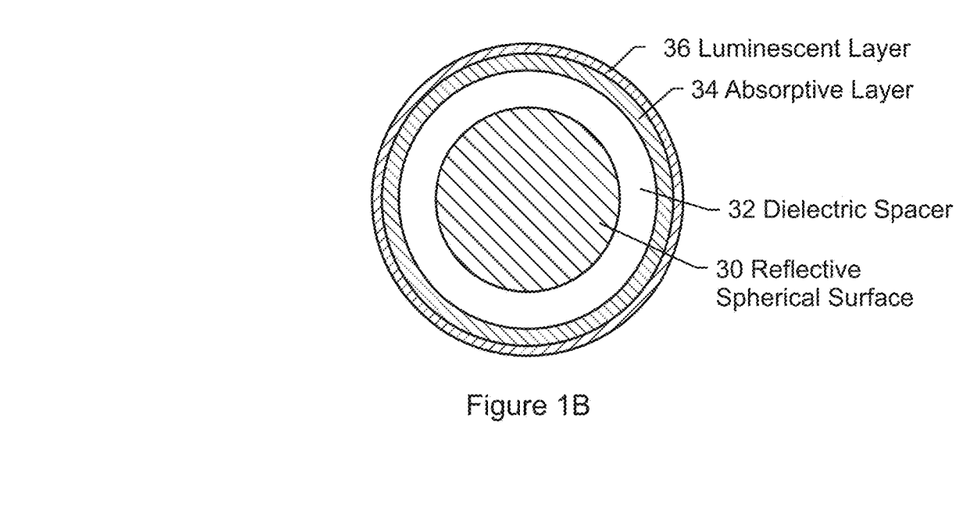
FIG. 1b is a block diagram of a photoluminescent device with spherical geometry including a mirror, a dielectric spacer, an absorptive layer, and a luminescent layer.

FIG. 1a is a block diagram of a photoluminescent device with planar geometry including a mirror 20, a dielectric medium or spacer 22, an absorptive layer 24 and a luminescent layer 26. It should be understood that the specific order of the various layers may be varies without departing from the scope of this disclosure. FIG. 1b is a block diagram of a photoluminescent device with spherical geometry including a mirror 30, a dielectric medium or spacer 32, an absorptive layer 34 and a luminescent layer 36. It should be understood that other geometric profiles may be used without departing from the disclosure herein. The absorptive layer 24, 34 is separated from the mirror 20, 30 by the transparent dielectric spacer 22, 32. It should be understood that the dielectric spacer has a thickness, e.g., as shown by reference number 28, selected to optimize performance of the photoluminescent device. For example, the dielectric spacer thickness may be selected to place the absorptive layer in front of a mirror at a distance approximately equal to $\lambda/4n$, where $\lambda$ is the wavelength of peak absorption in the absorptive layer and n is the refractive index of the medium. The lumophore whose brightness is to be enhanced is situated on top of the absorptive layer. The luminescent layer may contain organic or metal-organic dye molecules, semiconductor quantum dots, or other nanostructures of any luminescent material.

As discussed above, the structures disclosed herein do not apply exclusively to planar devices. Other geometries including anisotropic and nanostructured geometries may also be used. For instance, one embodiment may include a substantially reflective spherical or cylindrical surface (micron or sub-micron in size) coated with a dielectric layer, an absorptive layer, and finally the luminescent layer, as shown in FIG. 1b.

The resulting structure, referred to as a J-aggregate critically coupled resonator (JCCR), absorbs nearly all the incident light due to destructive interference between light reflected by the mirror and light reflected by the J-aggregate. 97% absorption can be achieved in 3 molecular layers, corresponding to a 5-nm thick film of J-aggregates in a JCCR structure and the same principle may be used to enhance the signal in surface enhanced Raman spectroscopy. The optical energy incident and absorbed in the JCCR structure is localized in the form of J-aggregate excitons. Target lumophores placed on the surface of the JCCR are coupled to these localized excitons by Förster resonant energy transfer (FRET) (FIG. 2a). As a result, the JCCR acts as a platform for strongly enhancing the effective optical absorption cross-section of the target lumophores, increasing their emission under fixed optical excitation. The presence of the mirror in this structure increases the absorption of the J-aggregate film but does not modify the rate of FRET between J-aggregate excitons and donor lumophores, which is a near-field interaction. Likewise, the emission rate of the donor lumophores is unaffected because the target lumophore emission is not resonant with the critically coupled resonator. The presence of the mirror may increase the forward outcoupling of the lumophore emission by a factor of ~2.

FIG. 2a is a block diagram of a J-aggregate critically coupled resonator (JCCR) fluorescence enhancement structure with 2.5 nm of DCM:Alq$_3$ (2.5% w/w) deposited on top as the exciton acceptor layer. FIG. 2b is a graph showing the calculated absorption of the JCCR as a function of SiO2 spacer layer thickness, showing a maximum at 50 nm, corresponding to a resonant condition. FIG. 2c is a graph showing absorption of the 15-nm thick J-aggregate thin film on quartz and increased absorption of the same film when placed on the critically coupled resonator and excited at 7° relative to normal incidence. FIG. 2d is a graph showing normalized absorption (solid lines) and emission (dashed lines) spectra of the J-aggregate and DCM:Alq$_3$ layers.

One feature of the disclosed enhancement method is the localization of optical energy in a thin nanocrystalline film of J-aggregates with a thickness comparable to the FRET radius for energy transfer from J-aggregates to DCM molecules. The J-aggregates used in this example are characterized by a narrow and intense absorption band centered at $\lambda=465$ nm (FIG. 2b), red-shifted relative to the monomer absorption, which is a result of coherent transition-dipole coupling between molecules within the aggregate. The J-aggregate solution is prepared by dissolving a thiacyanine dye 1 in 2,2,2-trifluoroethanol at a concentration of 1.5 mg/mL. The solution is then spin deposited either on a cleaned quartz substrate or on previously prepared critically coupled resonator (CCR) substrates rotated at 2000 RPM for 60 s. The resulting J-aggregate film is approximately 15 nm thick, as measured by atomic force microscopy step height analysis, and has a 20 nm FWHM absorption line with a peak absorption of 36%, corresponding to the absorption coefficient of $\alpha=3\times105$ cm$^{-1}$.

To form the CCRs, a 300 nm thick Ag mirror is thermally evaporated on a 1 mm thick quartz substrate at a pressure of $3\times10^{-6}$ Torr and a growth rate of 0.5 nm/s, producing a mirror with 97% reflectivity. The spacer layer, which separates the overlying J-aggregate film from the mirror, is formed by sputter depositing 50 nm of SiO2 on the Ag mirror. The 15 nm J-aggregate film is subsequently spin deposited on the SiO2 spacer layer. The spacer layer thickness is chosen such that the sum of the optical path length in SiO2 and the 30 nm optical penetration of the $\lambda=465$ nm light incident onto the Ag mirror results in the J-aggregate film being positioned at the anti-node of the electric field. Transfer matrix simulations, plotted in FIG. 2b, show that maximum absorption of the JCCR is achieved when the SiO2 spacer layer thickness is 50 nm, corresponding to the resonant condition.

Figure 3A:
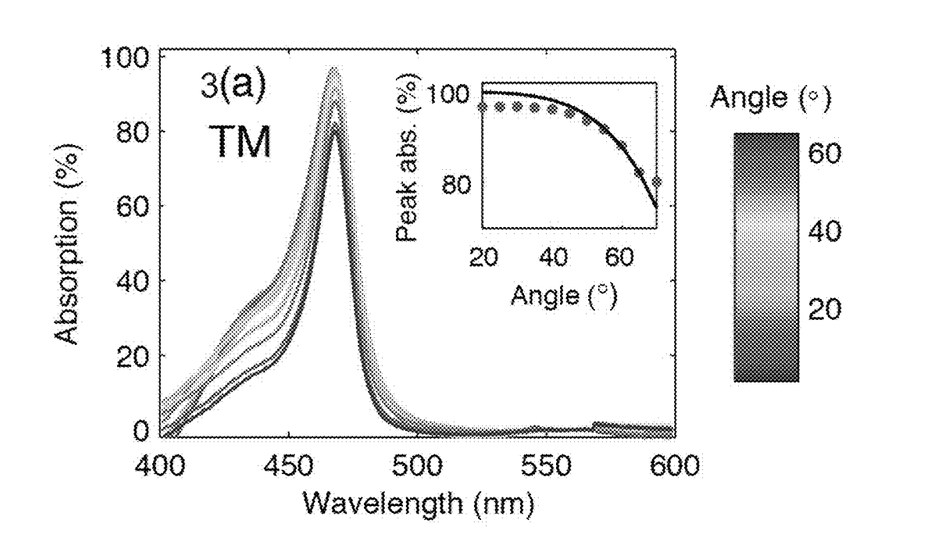
FIG. 3a is a graph showing the absorption spectrum of the JCCR structure as a function of angle of the incident TM.
Figure 3B:
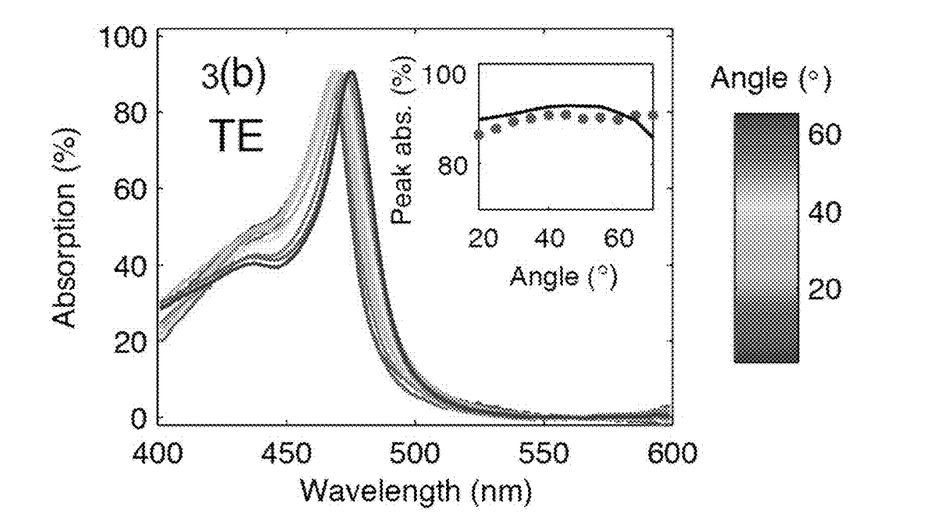
FIG. 3b is a graph showing the absorption spectrum of the JCCR structure as a function of angle of the incident TE polarized light.

FIG. 3a is a graph showing the absorption spectrum of the JCCR structure as a function of angle of the incident TM. FIG. 3b is a graph showing the absorption spectrum of the JCCR structure as a function of angle of the incident TE polarized light. Insets show the measured peak absorption at each angle (dots) and the absorption calculated using the transfer matrix formalism (black lines).

At the resonant condition, the peak absorption of the JCCR is 86% (FIG. 2c), measured by probing the reflectivity of the structure with unpolarized light at near-normal incidence (7° away from the normal). The linewidth of the J-aggregate film absorption in the JCCR geometry is increased from 17 to 25 nm due to the broad absorption tail to the blue of the main peak. FIGS. 3a and 3b show that the absorption of the JCCR is largely independent of angle for TE polarized excitation and falls off only slightly under TM polarized excitation. These measurements are in agreement with the transfer matrix simulations of the JCCR, as plotted in the insets of FIG. 3.

The JCCR structure may be used as a general platform for enhancing the absorption and fluorescence of luminescent nanostructures, such as organic molecules or quantum dots, deposited on top of the JCCR. The greatest fluorescence enhancement occurs when the overlap between the J-aggregate emission and the absorption of the overlying material is maximized, as this condition maximizes the rate of FRET. To that end, in the present example the J-aggregate emission spectrum (centered at $\lambda=470$ nm) overlaps with the absorption spectrum (centered at $\lambda=495$ nm) of the overlying DCM molecules, that will act as energy acceptors (FIG. 2b), resulting in a calculated FRET radius, RF, for J-aggregate to DCM energy transfer of 2.75 nm. 16 Furthermore, the DCM emission is centered at $\lambda=610$ nm, ensuring that the J-aggregate and DCM luminescence are spectrally separated, and is hence easy to resolve in optical measurements.

Figure 4A:
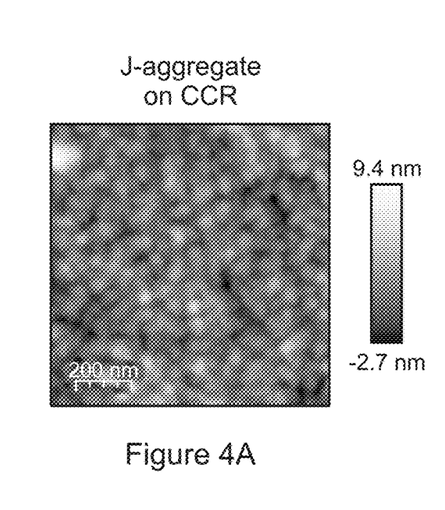
FIG. 4a is an AFM image of a J-aggregate on the CCR structure (RMS roughness 1.2±0.2 nm)
Figure 4B:
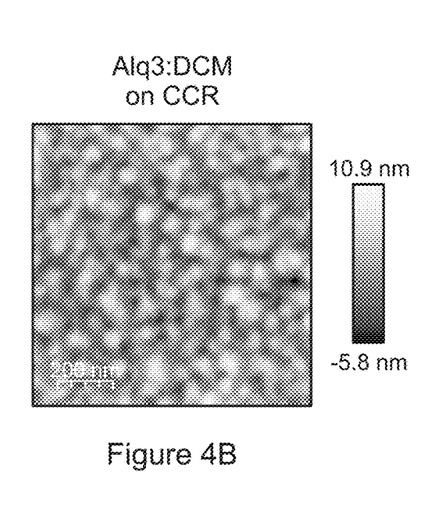
FIG. 4b is an AFM image of DCM:Alq$_3$ on the CCR structure (RMS roughness 1.2±0.1 nm)
Figure 4C:
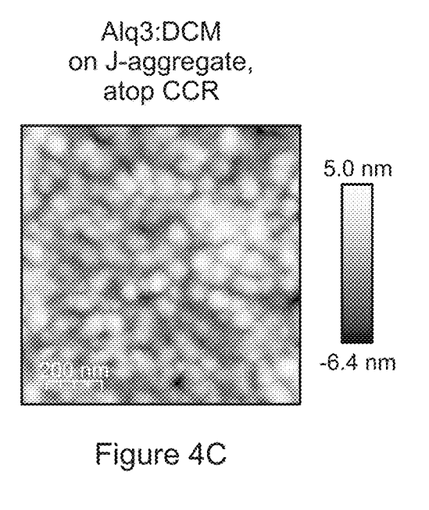
FIG. 4c is an AFM image of DCM:Alq$_3$ on the J-aggregate layer atop the CCR (RMS roughness 1.7±0.4 nm)

FIG. 4a is an AFM image of a J-aggregate on the CCR structure (RMS roughness 1.2±0.2 nm). FIG. 4b is an AFM image of DCM:Alq$_3$ on the CCR structure (RMS roughness 1.2±0.1 nm). FIG. 4c is an AFM image of DCM:Alq$_3$ on the J-aggregate layer atop the CCR (RMS roughness 1.7±0.4 nm).

DCM molecules are coated on top of the JCCR as a dilute thin film of DCM molecules doped at 2.5% w/w into Alq$_3$ (tris(8-hydroxyquinolinato)aluminum) molecular host material. Alq$_3$ molecules are optically transparent at the J-aggregate and DCM emission wavelengths. The DCM:Alq$_3$ film is 2.5 nm thick and is deposited on the JCCR structure by simultaneous thermal vacuum evaporation of Alq$_3$ and DCM at rates of 4 Å/s and 0.1 Å/s, respectively, and at a pressure of 3×10-6 Torr. The resulting effective thickness of the deposited DCM molecules is 0.06 nm, which is much thinner than a single molecular layer, and implies an incomplete DCM monolayer with an average separation between DCM molecules of 4 nm (as sketched in FIG. 1a). FIGS. 4a-4c show the surface morphology of the JCCR samples, characterized by atomic force microscopy (AFM) at various points in the fabrication process, with surface roughness of (1.7±0.4) nm for the completed structures. The low roughness allows the JCCR to be approximated as a one-dimensional structure, making it more conducive to modeling of FRET, exciton diffusion, and other dynamics in the system. The layered geometry is advantageous because it allows for the fluorescence enhancement of a range of materials that can be deposited by vacuum or solution methods directly onto the JCCR.

FIG. 5a is a graph showing the emission spectra of isolated DCM film, DCM film on JCCR, and the DCM contribution when atop the JCCR showing a 20-fold enhancement in the spectrally integrated DCM emission. FIG. 5b is an ambient light image of the DCM film deposited on the JCCR, and encapsulated with UV curing epoxy and a quartz cover slip. FIGS. 5c-5d are images of DCM emission on quartz substrate (5c) and on JCCR (5d) under $\lambda=465$ nm excitation. These images were taken with 0.1 s exposure and a $\lambda=550$ nm longpass filter. FIG. 5e is a graph showing the enhancement factor of DCM emission as a function of excitation wavelength and comparison to the absorption spectrum of the JCCR.

The layered geometry is advantageous because it allows for the fluorescence enhancement of a range of materials that can be deposited by vacuum or solution methods directly onto the JCCR. To prevent degradation of the organic layers under atmospheric exposure, the samples are encapsulated in a nitrogen glovebox using a ring of UV-curing air-impermeable epoxy and a quartz cover slip (FIG. 5b).

The enhancement of DCM fluorescence when on top of the JCCR is characterized by measuring both the internal quantum efficiency (IQE) and external quantum efficiency (EQE) of the structures in an integrating sphere. In this measurement the samples are situated at the center of the integrating sphere and illuminated with the output of a grating monochromator and a tungsten halogen lamp at an intensity of 60 µW/cm$^2$ at $\lambda=465$ nm and a spectral bandwidth of 6 nm. The PL is collected with an optical fiber and imaged on a CCD spectrograph. All collected spectra are corrected by calibrating the system using a halogen light source with a known spectrum.

As a control sample, the 2.5 nm film of DCM:Alq$_3$ may also simultaneously deposited on a quartz substrate and encapsulated in the nitrogen glove box. In this example, the absorption of the control film is measured to be 0.5%, with an IQE of 20%, and hence an EQE of 0.1%. Due to the low intensity of emission from the 2.5-nm film, the IQE of DCM:Alq$_3$ was determined by measuring the absorption and PL of a thick, 140-nm film deposited on quartz. The PL spectrum of the 2.5-nm DCM:Alq$_3$ control film is shown in FIG. 5a. An optical image of this sample under the same 60 µW/cm2 illumination taken with a digital SLR camera at 0.1 s exposure and a $\lambda=550$ nm longpass filter shows almost no visible emission (FIG. 5c).

Upon deposition of the same DCM:Alq$_3$ film on the JCCR structure, the DCM emission is dramatically enhanced. FIG. 5a shows the emission spectrum from the DCM-on-JCCR structure, which is a sum of the enhanced DCM emission and the red tail of the J-aggregate emission. Subtraction of the J-aggregate tail from the total PL spectrum isolates the DCM contribution. This wavelength-integrated JCCR-enhanced DCM emission is 20 times greater than the wavelength-integrated emission from the control DCM sample. The optical image of the enhanced DCM sample (FIG. 5d), taken under the same conditions as the control sample (FIG. 5c), shows visual verification of the dramatic enhancement in fluorescence from a sub-monolayer equivalent of DCM molecules. The EQE of the DCM is enhanced to 2.2%, while the IQE remains unchanged at 20%. In other words, the effect of the FRET coupling to the JCCR is to increase the effective absorption cross-section of the DCM molecules (and hence absorption coefficient of the film). The original cross-section of the DCM molecules is $\sigma_D=1.3\times10^{-16}$ cm$^2$ ($\alpha_D=2\times10^4$ cm$^{-1}$) for the control DCM film. When coupled to the JCCR the DCM cross-section is effectively enhanced to $\sigma_{D,JCCR}=2.6\times10^{-15}$ cm$^2$ ($\alpha_{D,JCCR}=4\times10^5$ cm$^{-1}$).

The fluorescence enhancement factor is maximized when the excitation is resonant with the J-aggregate absorption and the CCR spacing ($\lambda=465$ nm). FIG. 5e shows the enhancement factor for a range of excitation wavelengths, and is observed to follow the absorption spectrum of the JCCR. Significant enhancement (>7 fold) occurs over a 40 nm range, making this excitonic approach to fluorescence enhancement suitable for applications where the incident illumination has appreciable spectral bandwidth.

Figure 6:
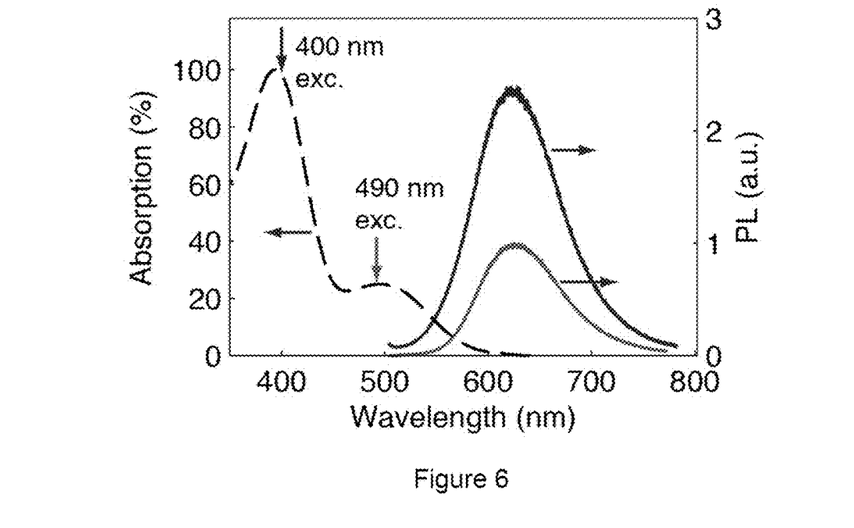
FIG. 6 is a graph showing a factor of 2 enhancement in DCM emission, observed due to energy transfer from Alq$_3$ in a 140 nm thick film of DCM:Alq$_3$.

FIG. 6 is a graph showing a factor of 2 enhancement in DCM emission, observed due to energy transfer from $Alq_3$ in a 140 nm thick film of DCM:$Alq_3$. This is significantly less than the 20-fold enhancement observed when using the JCCR. The DCM was excited directly at λ=490 nm, while the $Alq_3$ is excited at λ=400 nm at the same intensity.

It is instructive to compare the fluorescence enhancement provided by the JCCR structure to the enhancement achieved when the DCM is excited by FRET from the $Alq_3$ host material. Enhancement in DCM emission is expected because a large number of $Alq_3$ molecules within the FRET radius can excite the DCM molecule. Such a guest-host excitation scheme has previously been used in the excitation of organic LEDs 18 and organic solid state lasers. 19 A DCM:$Alq_3$ film (140 nm thick) was prepared on a quartz substrate and excited at two wavelengths: at λ=400 nm, where $Alq_3$ absorption dominates, and at λ=490 nm, the peak of the DCM absorption. The integrated intensity of the DCM emission when pumping the DCM indirectly by energy transfer from $Alq_3$ is found to be only a factor of 2 higher than when exciting the DCM directly (FIG. 6)—10 times less enhancement than achieved with the JCCR structure.

Figure 7:
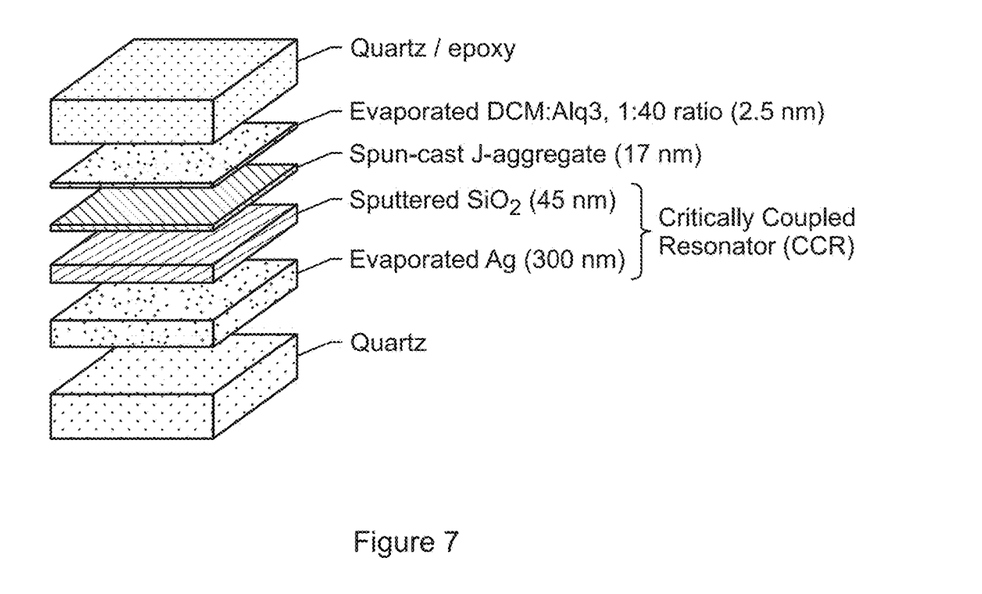
FIG. 7 is a schematic illustration of another embodiment of a photoluminescent device.

FIG. 7 is a schematic illustration of another embodiment. In this example, the device includes of a 300 nm thick evaporated Ag mirror, a 45 nm thick sputtered $SiO_2$ dielectric spacer, a 17 nm thick spun-cast film of a J-aggregating thiacyanine dye (NK 3989—the absorptive layer), and a 2.5 nm thick layer of tris-(8-hydroxyquinoline) aluminum ($Alq_3$) doped with 4-dicyarunethylene-2-methyl-6-(p-dimethylaminostryryl)-4H-pyran (DCM) at a ratio of 1:40, or 2.5% (the luminescent layer). The device is built on top of a quartz glass substrate and sealed from oxygen and moisture with a glass cover slide and UV-curable epoxy.

Figure 8:
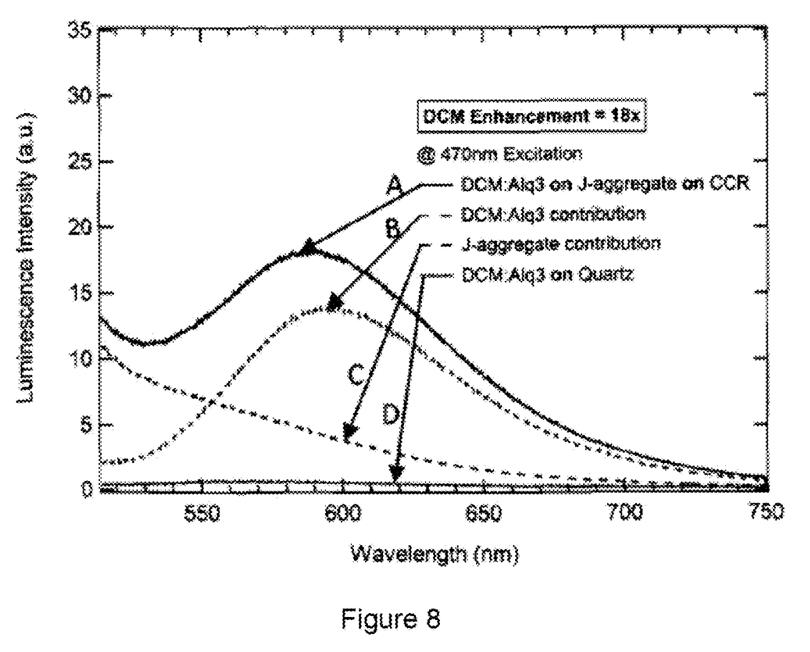
FIG. 8 is a graph showing luminescence intensity from a 2.5 nm thick DCM:Alq$_3$ film supported on a quartz glass substrate.

The luminescence enhancing properties of this device are shown in FIG. 8. Curve D shows luminescence intensity from a 2.5 run thick DCM:$Alq_3$ film supported on a quartz glass substrate. Curve A shows luminescence intensity when the same thickness DCM/$Alq_3$ film is deposited on top of the prototype device as illustrated in FIG. 7. Because the DCM luminescence spectrum overlaps some with J-aggregate fluorescence, the separated DCM and J-aggregate contributions (curves B and C, respectively) are shown for clarity. Curve B indicates a luminescence enhancement of ~1700%, or 18 times higher than DCM:Alq3 on quartz alone. Theses luminescence spectra were collected inside an integrating sphere under 60 μW/0.5 $cm^2$ incoherent (i.e. non-laser) CW photoexcitation at 470 run.

The disclosed JCCR structures are general platforms for absorption (and hence fluorescence) enhancement of a wide range of nanostructured materials, including organic molecules and semiconductor quantum dots. As disclosed herein, a model system shows a 20-fold enhancement in the absorption cross-section of the organic dye DCM measured through the enhancement of the molecular fluorescence. The enhancement is obtained due to FRET coupling of the DCM molecules to the strongly absorbing JCCR structure. The absorption of the JCCR is found to be over 80% for incidence angles from 7° to 70° and the fluorescence enhancement greater than a factor of 7 was observed over a 40 nm excitation bandwidth, making this approach appropriate for applications where the incident light is spectrally broad and not directional. The fluorescence enhancement factor can be improved by optimizing the J-aggregate material for increased exciton diffusion length in the direction transverse to the plane of the film, thus transferring a larger fraction of the generated excitons to the acceptor layer.

The disclosed JCCR systems may be a platform for a number of applications where efficient absorption and reemission of light is critical. For example, in LED lighting with luminescent downconversion, the luminescent emitters can represent a significant fraction of the total cost of the luminescent optical elements. By enhancing the quantum dot emission using the JCCR design, the required amount of material could be substantially reduced. Likewise the JCCR can be used for absorption enhancement of the photosensitive material in a photodetector. The system may also be extended to the regime of high-efficiency single photon optics by optimizing the J-aggregate to acceptor FRET and by harnessing the enhancement due to lateral diffusion of excitons in the J-aggregate film in the low density limit of acceptors. Such a system could be the building block for single molecule FRET microscopy.

It should be understood that many variations are possible based on the disclosure herein. Although features and elements are described above in particular combinations, each feature or element can be used alone without the other features and elements or in various combinations with or without other features and elements.

What is claimed is:

1. A device exhibiting enhanced luminescence, comprising:
    a mirror coupled overlying a dielectric spacer;
    an absorptive layer a luminescent layer overlying the dielectric spacer;
    the absorptive layer having a wavelength of peak absorption and the luminescent layer having an absorption bandwidth, the absorptive layer being configured to re-emit in a bandwidth that overlaps with the absorption bandwidth of the luminescent layer;
    the dielectric spacer having a thickness of about one-fourth of the wavelength of peak absorption of the absorptive layer divided by the refractive index, forming a critically coupled resonator configured to maximize intensity of luminescence from the luminescent layer.

2. The device of claim 1, further comprising a substrate on which at least one of the mirror absorptive layer and the luminescent layer are formed.

3. The device of claim 1, further comprising a transparent cover overlying the mirror, dielectric spacer, absorptive layer and luminescent layer.

4. The device of claim 1, wherein the luminescent layer comprises at least one of:
    metal-organic dye molecules, semiconductor quantum dots and a nanostructure of a luminescent material.

5. The device of claim 1, wherein the luminescent layer comprises DCM.

6. The device of claim 1, wherein the luminescent layer comprises $Alq_3$.

7. The device of claim 1, wherein the absorptive layer comprises a J-aggregating thiacyanine dye.

8. The device of claim 1, wherein the luminescent layer is configured to emit luminescence by absorbing energy of the incident light from the absorptive layer via exciton diffusion and resonant energy transfer.

9. The device of claim 1, wherein the absorptive layer comprises a material having an exciton diffusion length, the absorptive layer having a thickness less than the exciton diffusion length.

10. The device of claim 1, wherein the device is substantially spherical.

11. The device of claim 1, wherein the mirror, dielectric spacer, absorptive layer and luminescent layer are arranged concentrically about the substrate.

12. A method of forming a device exhibiting enhanced luminescence, the method comprising:
 forming a mirror coupled overlying a dielectric spacer;
 forming an absorptive layer and a luminescent layer overlying the dielectric spacer;
 the absorptive layer having a wavelength of peak absorption and the luminescent layer having an absorption bandwidth, the absorptive layer being configured to re-emit in a bandwidth that overlaps with the absorption bandwidth of the luminescent layer;
 the dielectric spacer having a thickness of about one-fourth of the wavelength of peak absorption of the absorptive layer divided by the refractive index, forming a critically coupled resonator configured to maximize intensity of luminescence from the luminescent layer.

13. The method of claim 12, further comprising providing a substrate on which at least one of the mirror absorptive layer and the luminescent layer are formed.

14. The method of claim 12, further comprising forming a transparent cover overlying the mirror, dielectric spacer, absorptive layer and luminescent layer.

15. The method of claim 12, wherein the luminescent layer comprises at least one of:
 metal-organic dye molecules, semiconductor quantum dots and a nanostructure of a luminescent material.

16. The method of claim 12, wherein the luminescent layer comprises DCM.

17. The method of claim 12, wherein the luminescent layer comprises $Alq_3$.

18. The method of claim 12, wherein the absorptive layer comprises a J-aggregating thiacyanine dye.

19. The method of claim 12, wherein the luminescent layer is configured to emit luminescence by absorbing energy of the incident light from the absorptive layer via exciton diffusion and resonant energy transfer.

20. The method of claim 12, wherein the absorptive layer comprises a material having an exciton diffusion length, the absorptive layer having a thickness less than the exciton diffusion length.

21. The method of claim 12, wherein the device is substantially spherical.

22. The method of claim 12, wherein the mirror, dielectric spacer, absorptive layer and luminescent layer are arranged concentrically about the substrate.

* * * * *